(12) United States Patent
Ito

(10) Patent No.: US 9,412,688 B2
(45) Date of Patent: Aug. 9, 2016

(54) WIRING BOARD

(71) Applicant: KYOCERA Circuit Solutions, Inc., Kyoto (JP)

(72) Inventor: Takayuki Ito, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/806,803

(22) Filed: Jul. 23, 2015

(65) Prior Publication Data
US 2016/0027724 A1    Jan. 28, 2016

(30) Foreign Application Priority Data

Jul. 25, 2014   (JP) ................. 2014-151299

(51) Int. Cl.
| | |
|---|---|
| H01L 23/48 | (2006.01) |
| H01L 23/498 | (2006.01) |
| H05K 1/11 | (2006.01) |
| H01L 23/04 | (2006.01) |
| H01L 23/10 | (2006.01) |

(52) U.S. Cl.
CPC .......... *H01L 23/49822* (2013.01); *H01L 23/04* (2013.01); *H01L 23/10* (2013.01); *H01L 23/49827* (2013.01); *H01L 23/49838* (2013.01); *H05K 1/111* (2013.01); *H05K 2201/10969* (2013.01); *H05K 2201/10984* (2013.01)

(58) Field of Classification Search
CPC ....................................................... H01L 21/50
See application file for complete search history.

(56) References Cited

U.S. PATENT DOCUMENTS

2009/0121334 A1 *  5/2009  Oi .................. H01L 21/6835
                                                              257/678

FOREIGN PATENT DOCUMENTS

JP         2006-210530 A     8/2006

* cited by examiner

*Primary Examiner* — William Harriston
(74) *Attorney, Agent, or Firm* — Volpe and Koenig, P.C.

(57) ABSTRACT

The wiring board of the present invention includes at least one insulating layer and at least one conductor layer being alternately laminated, a semiconductor element connection pad formed on an upper surface of the insulating layer at an uppermost layer of the insulating layers, a cap connection pattern arranged so as to surround a region where the semiconductor element connection pad is formed, and at least one strip-shaped pattern extending from the semiconductor element connection pad to a region outside an end portion on the region side of the cap connection pattern. The cap connection pattern is formed by a plurality of island-shaped patterns spaced apart from one another, and the strip-shaped pattern is formed between the adjacent island-shaped patterns on the upper surface of the insulating layer at the uppermost layer.

4 Claims, 3 Drawing Sheets

WIRING BOARD

BACKGROUND OF THE INVENTION

1. Technical Field

The present invention relates to a wiring board for mounting a semiconductor element such as a semiconductor integrated circuit element.

2. Background

Conventionally, as a wiring board for mounting a semiconductor element such as a semiconductor integrated circuit element, a wiring board formed by a build-up method is known (for example, Japanese Unexamined Patent Application Publication No. 2006-210530). FIG. 3A is a schematic sectional view illustrating a state where a semiconductor element E' is mounted on and a metal cap C' is joined to a conventional wiring board 40 formed by the build-up method. FIG. 3B is a top view of the conventional wiring board 40. As shown in FIGS. 3A and 3B, the conventional wiring board 40 has a structure where an insulating layer 23 for the build-up and a conductor layer 24 for the build-up are laminated on the upper and lower surfaces of an insulating layer 21 for the core having a conductor layer 22 for the core. Furthermore, a solder resist layer 32 is deposited on a surface of the insulating layer 23 for the build-up and a surface of the conductor layer 24 for the build-up formed at the outermost layer. In this wiring board 40, the semiconductor element E' is mounted on the upper surface and the metal cap C' is joined to the upper surface so as to cover the semiconductor element E'. The lower surface of the wiring board 40 is a connection surface for connecting with an external electric circuit board. In FIG. 3B, a covered part by the solder resist layer 32 of the conductor layer 24 for the build-up formed at the outermost layer on the upper surface side is indicated by a broken line.

The insulating layer 21 for the core includes, for example, an electrically insulating material where a glass cloth is impregnated with a thermosetting resin such as an epoxy resin. In the insulating layer 21 for the core, a plurality of through-holes 25 penetrating from the upper surface to the lower surface of the insulating layer 21 for the core are formed. The conductor layer 22 for the core is deposited on the upper and lower surfaces of the insulating layer 21 for the core and in the through-hole 25. The conductor layer 22 for the core includes, for example, a highly conductive metal material such as copper foil or a copper plating layer. The inside of the through-hole 25 where the conductor layer 22 for the core is deposited is filled with a hole filling resin 26.

The insulating layer 23 for the build-up includes, for example, a thermosetting resin such as an epoxy resin. From the upper surface to the lower surface of the insulating layer 23 for the build-up, a plurality of via holes 27 are formed. The conductor layer 24 for the build-up is deposited on the surface of the insulating layer 23 for the build-up and in the via hole 27. The conductor layer 24 for the build-up includes a highly conductive metal material such as a copper plating layer.

A part of the conductor layer 24 for the build-up formed at the outermost layer on the upper surface side forms a circular semiconductor element connection pad 28 electrically connected to an electrode terminal of the semiconductor element E'. The semiconductor element connection pad 28 is formed in the row corresponding to an electrode terminal of the semiconductor element E'. The electrode of the semiconductor element E' and the semiconductor element connection pad 28 are connected with a solder S1' interposed therebetween.

Furthermore, another part of the conductor layer 24 for the build-up formed at the outermost layer on the upper surface side forms a frame-shaped cap connection pattern 29 connected to the metal cap C'. The cap connection pattern 29 is formed so as to surround the region where the semiconductor element connection pads 28 are formed. The metal cap C' and the cap connection pattern 29 are joined with a solder S2' interposed therebetween. The cap connection pattern 29 is connected to a ground potential. Therefore, the metal cap C' connected to this cap connection pattern 29 with the solder S2' interposed therebetween is also connected to the ground potential. As a result, the metal cap C' functions as a shield against the semiconductor element E'.

A part of the conductor layer 24 for the build-up formed at the outermost layer on the lower surface side forms a circular external connection pad 30 electrically connected to the wiring conductor of the external electric circuit board. The external connection pad 30 is formed, for example, in a lattice shape.

The conductor layer 24 for the build-up includes wiring conductors for grounding, a power supply, and a signal. The wiring conductor for the grounding is electrically connected to the cap connection pattern 29. The wiring conductor for the signal includes a strip-shaped pattern 31 extending from the bottom of the semiconductor element connection pad 28 to the outside of the cap connection pattern 29 between the insulating layers 23 for the build-up formed on the upper surface side.

Furthermore, the solder resist layer 32 is deposited on the surfaces of the insulating layer 23 for the build-up and the conductor layer 24 for the build-up formed at the outermost layer on the upper surface side and lower surface side. The solder resist layer 32 includes a thermosetting resin such as an epoxy resin. In the solder resist layer 32, opening portions configured to expose the semiconductor element connection pad 28, the cap connection pattern 29, and the external connection pad 30 are formed.

However, in the conventional wiring board 40, the cap connection pattern 29 has a frame shape. Therefore, when the strip-shaped pattern 31 for the signal is attempted to extend to the outside of the cap connection pattern 29, it is necessary to extend the strip-shaped pattern 31 for the signal under the cap connection pattern 29 with at least one insulating layer 23 for the build-up interposed therebetween. Therefore, in the conventional wiring board 40, there has been a problem that the number of layers of the required insulating layers 23 for the build-up is increased, and that the thickness of the wiring board 40 is increased by the corresponding amount.

SUMMARY

The present invention provides a wiring board including a strip-shaped pattern for a signal extending at least to the outside of an end portion inside a cap connection pattern without passing through under the cap connection pattern, and having a thin thickness due to the number of layers of required insulating layers being reduced.

The wiring board according to an embodiment of the present invention includes at least one insulating layer and at least one conductor layer being alternately laminated, a semiconductor element connection pad including the conductor layer, formed on an upper surface of the insulating layer at an uppermost layer of the insulating layers, a cap connection pattern including the conductor layer, arranged so as to surround a region where the semiconductor element connection pad is formed, and at least one strip-shaped pattern including the conductor layer, extending from the semiconductor element connection pad to a region outside an end portion on the region side of the cap connection pattern. The cap connection pattern is formed by a plurality of island-shaped patterns spaced apart from one another, and the strip-shaped pattern is formed between the adjacent island-shaped patterns on the upper surface of the insulating layer at the uppermost layer.

According to the wiring board according to an embodiment of the present invention, the cap connection pattern is formed by a plurality of the island-shaped patterns spaced apart from one another. The strip-shaped pattern is formed between the adjacent island-shaped patterns. Therefore, it is possible to reduce the number of layers of the insulating layers required for providing the strip-shaped pattern. As a result, the thin wiring board can be provided.

DETAILED DESCRIPTION

Figure 1A:
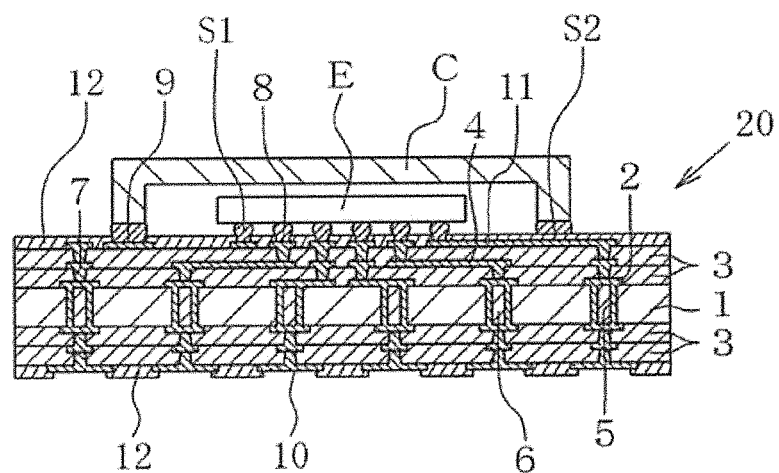
FIGS. 1A and 1B are a schematic sectional view and a top view showing a wiring board according to an embodiment of the present invention.
Figure 1B:
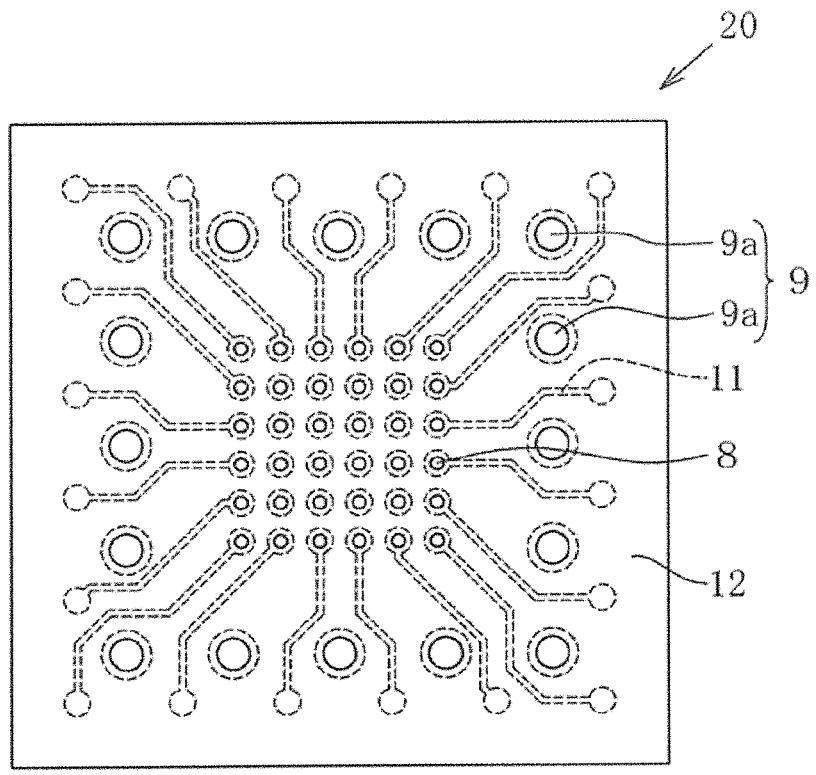

The wiring board according to one embodiment of the present invention will be described with reference to FIGS. 1A and 1B. FIG. 1A is a schematic sectional view illustrating a state where a semiconductor element E is mounted on and a metal cap C is joined to a wiring board 20 according to the one embodiment formed by the build-up method. FIG. 1B is a top view of the wiring board 20 according to the one embodiment.

As shown in FIGS. 1A and 1B, the wiring board 20 has a structure where an insulating layer 3 for the build-up and a conductor layer 4 for the build-up are laminated on the upper and lower surfaces of an insulating layer 1 for the core having a conductor layer 2 for the core. Furthermore, a solder resist layer 12 is deposited on a surface of the insulating layer 3 for the build-up and a surface of the conductor layer 4 for the build-up formed at the outermost layer. In this wiring board 20, the semiconductor element E is mounted on the upper surface and the metal cap C is joined to the upper surface so as to cover the semiconductor element E. The lower surface of the wiring board 20 is a connection surface for connecting with an external electric circuit board. In FIG. 1B, the covered part by the solder resist layer 12 is indicated by a broken line out of the conductor layer 4 for the build-up formed at the outermost layer on the upper surface side.

The insulating layer 1 for the core includes, for example, an electrically insulating material where a glass cloth in which a glass fiber bundle is woven in the vertical and horizontal directions is impregnated with a thermosetting resin such as a bismaleimide triazine resin and an epoxy resin. The thickness of the insulating layer 1 for the core is about 100 to 1000 μm. In the insulating layer 1 for the core, a through-hole 5 penetrating from the upper surface to the lower surface of the insulating layer 1 for the core is formed. The diameter of the through-hole 5 is about 100 to 300 μm.

The conductor layer 2 for the core is deposited on the upper and lower surfaces of the insulating layer 1 for the core and in the through-hole 5. The conductor layer 2 for the core includes, for example, a highly conductive metal material such as copper foil and a copper plating layer. The thickness of the conductor layer 2 for the core is, for example, about 5 to 25 μm. The conductor layer 2 for the core electrically connects the upper and lower conductor layers 4 for the build-up with the insulating layer 1 for the core interposed therebetween. The inside of the through-hole 5 where the conductor layer 2 for the core is deposited is filled with a hole filling resin 6 including a thermosetting resin such as an epoxy resin.

The insulating layer 3 for the build-up includes, for example, an insulating material including a thermosetting resin such as an epoxy resin. The thickness of the insulating layer 3 for the build-up is about 10 to 50 μm. In each of the insulating layers 3 for the build-up, a via hole 7 penetrating from the upper surface to the lower surface of the insulating layer 3 for the build-up is formed. The diameter of the via hole 7 is about 50 to 100 μm. The conductor layer 4 for the build-up is deposited on the surface of the insulating layer 3 for the build-up and in the via hole 7. The conductor layer 4 for the build-up includes a highly conductive metal material such as a copper plating layer. The thickness of the conductor layer 4 for the build-up is about 5 to 25 μm.

A part of the conductor layer 4 for the build-up formed at the outermost layer on the upper surface side forms a semiconductor element connection pad 8 electrically connected to an electrode terminal of the semiconductor element E with a solder S1 interposed therebetween. The shape of the semiconductor element connection pad 8 is not limited, and is, for example, a circular shape, an elliptical shape, a polygonal shape (a triangular shape, a quadrangular shape, a pentagonal shape, a hexagonal shape, etc.) and the like. The semiconductor element connection pad 8 is formed in the row corresponding to an electrode terminal of the semiconductor element E. When the semiconductor element connection pad 8 has a circular shape, its diameter is about 50 to 100 μm.

Furthermore, another part of the conductor layer 4 for the build-up formed at the outermost layer on the upper surface side forms a cap connection pattern 9 electrically connected to the metal cap C with a solder S2 interposed therebetween. The cap connection pattern 9 is formed by a plurality of island-shaped patterns 9a spaced apart from one another. The island-shaped patterns 9a are arranged so that the interval of the narrowest part is, for example, about 30 to 3000 μm. The cap connection pattern 9 is arranged so as to surround the region where the semiconductor element connection pads 8 are formed. The cap connection pattern 9 is connected to a ground potential. Therefore, the metal cap C connected to this cap connection pattern 9 with the solder S2 interposed therebetween is also connected to the ground potential. As a result, the metal cap C functions as a shield against the semiconductor element E.

A part of the conductor layer 4 for the build-up formed at the outermost layer on the lower surface side forms an external connection pad 10 electrically connected to a wiring conductor of an external electric circuit board. The shape of the external connection pad 10 is not limited, and is, for example, a circular shape, an elliptical shape, a polygonal shape (a triangular shape, a quadrangular shape, a pentagonal shape, a hexagonal shape, etc.) and the like. The external connection pad 10 is formed in a lattice shape. When the external connection pad 10 has a circular shape, its diameter is about 250 to 1000 μm.

The conductor layer 4 for the build-up includes wiring conductors for grounding, a power supply, and a signal. The wiring conductor for the grounding is electrically connected to the cap connection pattern 9. The wiring conductor for the signal includes a strip-shaped pattern 11 formed on the upper surface of the insulating layer 3 for the build-up formed at the outermost layer on the upper surface side. The strip-shaped pattern 11 extends through between the adjacent island-shaped patterns 9a from the semiconductor element connection pad 8 to the outside of the cap connection pattern 9.

Thus, according to the wiring board 20 shown in FIGS. 1A and 1B, the cap connection pattern 9 is formed by a plurality of island-shaped patterns 9a spaced apart from one another. The strip-shaped pattern 11 extends through between the adjacent island-shaped patterns 9a on the upper surface of the insulating layer 3 for the build-up formed at the outermost layer on the upper surface side. Therefore, it is possible to reduce the number of layers of the insulating layers 3 required for providing the strip-shaped pattern 11. As a result, it is possible to provide the thin wiring board 20.

Furthermore, the solder resist layer 12 is deposited on the surfaces of the insulating layer 3 for the build-up and the conductor layer 4 for the build-up formed on the upper surface side and lower surface side. The solder resist layer 12 includes a thermosetting resin such as an epoxy resin and has a thickness of about 10 to 30 μm. The solder resist layer 12 covers the strip-shaped pattern 11 on the upper surface of the insulating layer 3 for the build-up formed at the outermost layer on the upper surface side, and has opening portions for exposing the semiconductor element connection pad 8, the cap connection pattern 9, and the external connection pad 10. Thereby, even when the metal cap C is connected to the cap connection pattern 9 with the solder S2 interposed therebetween, the electrical insulation between the strip-shaped pattern 11 and the metal cap C is secured.

Figure 2A:
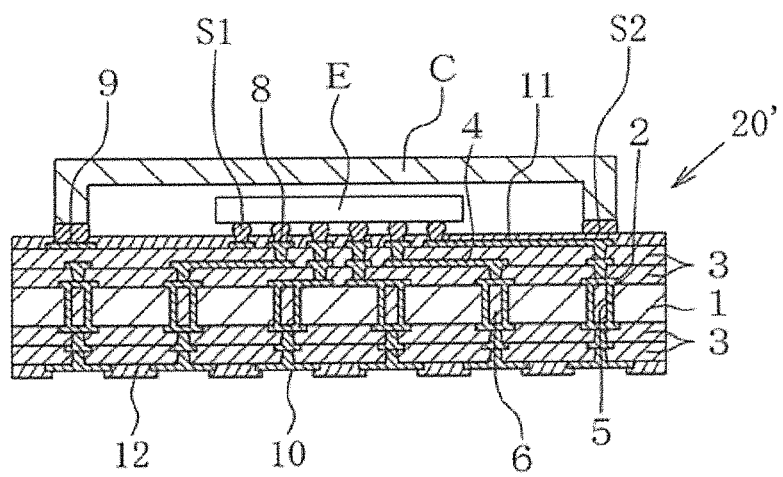
FIGS. 2A and 2B are a schematic sectional view and a top view showing a wiring board according to another embodiment of the present invention.
Figure 2B:
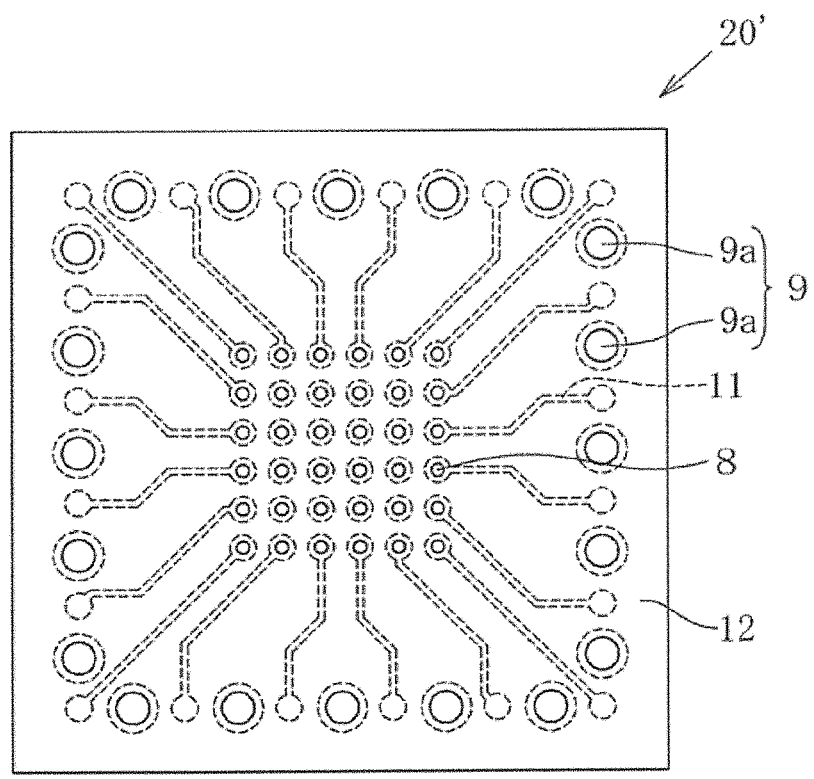
Figure 3A:
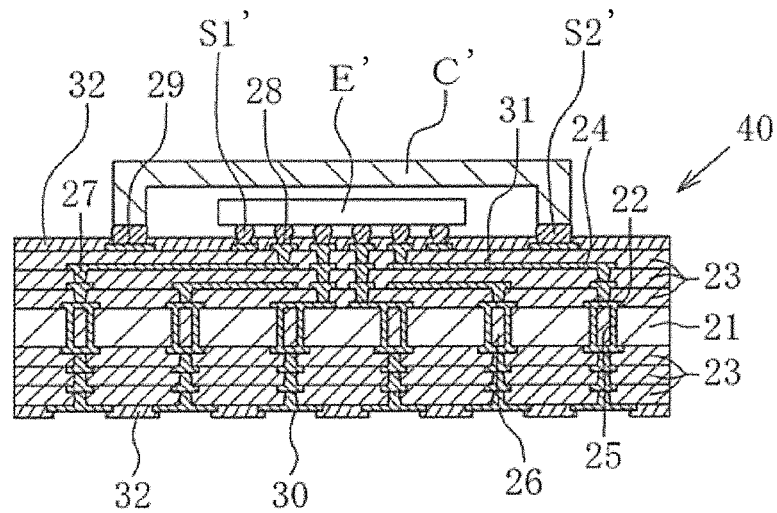
FIGS. 3A and 3B are a schematic sectional view and a top view showing a conventional wiring board.
Figure 3B:
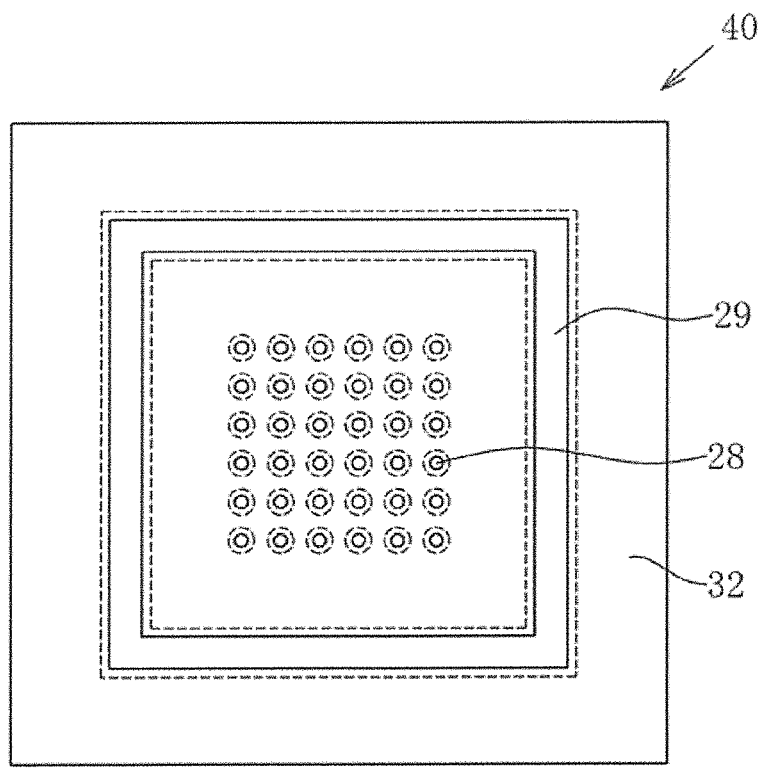

The present invention is not limited to the one embodiment described above, and various modifications are possible as long as they are within the scope of the claims. For example, in the wiring board 20 according to the one embodiment described above, the strip-shaped pattern 11 extends through between the island-shaped patterns 9a forming the cap connection pattern 9. However, as in a wiring board 20' according to another embodiment shown in FIGS. 2A and 2B, the strip-shaped pattern 11 may include its tip arranged between adjacent island-shaped patterns 9a.

In the wiring board 20 according to the one embodiment and the wiring board 20' according to the another embodiment described above, the island-shaped pattern 9a forming the cap connection pattern 9 has a circular shape. However, the shape of the island-shaped pattern is not limited to a circular shape, and may be another shape such as an elliptical shape, a polygonal shape (a triangular shape, a quadrangular shape, a pentagonal shape, a hexagonal shape, and the like).

In the wiring board 20 according to the one embodiment described above, one or two strip-shaped patterns 11 extend through between the adjacent island-shaped patterns 9a. However, there may be a space between island-shaped patterns where three or more strip-shaped patterns pass through. Furthermore, in the wiring board 20' according to the another embodiment described above, one tip of the strip-shaped pattern 11 is arranged between the adjacent island-shaped patterns 9a. However, there may be a space between island-shaped patterns where two or more tips of the strip-shaped patterns are arranged.

What is claimed is:

1. A wiring board comprising:
    at least one insulating layer and at least one conductor layer being alternately laminated;
    a semiconductor element connection pad including the conductor layer, formed on an upper surface of the insulating layer at an uppermost layer of the insulating layers;
    a cap connection pattern including the conductor layer, electrically connected to a metal cap with a solder, arranged so as to surround a region, in a plan view, where the semiconductor element connection pad is formed; and
    at least one strip-shaped pattern including the conductor layer, extending from the semiconductor element connection pad to a region outside an end portion on the region side of the cap connection pattern,
    wherein the cap connection pattern is formed by a plurality of island-shaped patterns spaced apart from one another, and
    wherein the strip-shaped pattern is formed between the adjacent island-shaped patterns on the upper surface of the insulating layer at the uppermost layer.

2. The wiring board according to claim 1, wherein at least one strip-shaped pattern of the strip-shaped patterns extends through between the adjacent island-shaped patterns.

3. The wiring board according to claim 1, wherein at least one strip-shaped pattern of the strip-shaped patterns includes a tip arranged between the adjacent island-shaped patterns.

4. A semiconductor device comprising:
    the wiring board according to claim 1;
    a semiconductor element mounted on the wiring board; and
    a metal cap electrically connected to the cap connection pattern formed in the wiring board with solder interposed therebetween.

* * * * *